United States Patent
Balakrishnan et al.

(10) Patent No.: US 7,330,140 B2
(45) Date of Patent: Feb. 12, 2008

(54) INTERLEAVED ANALOG TO DIGITAL CONVERTER WITH COMPENSATION FOR PARAMETER MISMATCH AMONG INDIVIDUAL CONVERTERS

(75) Inventors: Jaiganesh Balakrishnan, Bangalore (IN); Venugopal Gopinathan, Bangalore (IN); Sthanunathan Ramakrishnan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/309,081

(22) Filed: Jun. 16, 2006

(65) Prior Publication Data

US 2007/0069937 A1    Mar. 29, 2007

Related U.S. Application Data

(60) Provisional application No. 60/696,248, filed on Jul. 1, 2005.

(51) Int. Cl.
*H03M 1/06*    (2006.01)
(52) U.S. Cl. .................. 341/118; 341/155; 341/141
(58) Field of Classification Search ............ 341/118, 341/141, 155, 110, 126
See application file for complete search history.

(56) References Cited

U.S. PATENT DOCUMENTS 5,239,299 A * 8/1993 Apple et al. ................. 341/118
2005/0151679 A1* 7/2005 Adams ........................ 341/141

OTHER PUBLICATIONS

Shafiq M. Jamal, Daihong Fu, Mahendra P. Singh, Paul J. Hurst and Stephen H. Lewis, "Calibration of Sample-Time Error in a Two-Channel Time-Interleaved Analog-to-Digital Converter", IEEE Transactions on Circuits and Systems—I: Regular Papers, vol. 51, No. 1, pp. 130-139, Jan. 2004.

Kenneth C. Dyer, Daihong Fu, Stephen H. Lewis and Paul J. Hurst. "An Analog Background Calibration Technique for Time-Interleaved Analog-to-Digital Converters", IEEE Journal of Solid-State Circuits, vol. 33, No. 12, pp. 1912 to 1919, Dec. 1998.

Yun Chiu, Cheongyuen W. Tsang, Borivoje Nikolic and Paul R. Gray, "Least Mean Square Adaptive Digital Background Calibration of Pipelined Analog-to-Digital Converters" IEEE Transactions on Circuits and Systems—I: Regular Papers, vol. 51, No. 1, 38-46, pages Jan. 2004.

Oscar E. Agazzi and Venugopal Gopinathan, "Background Calibration of Interleaved Analog to Digital Converters for High-Speed Communications Using Interleaved Timing Recovery Techniques" from IEEE Journal, vol. 2 pp. 1390-1393, Broadcom Corporation, 16215 Alton Parkway, Irvine, CA 92606, USA, May 2005.

* cited by examiner

*Primary Examiner*—Jean Bruner Jeanglaude
(74) *Attorney, Agent, or Firm*—Steven A. Shaw; W. James Brady; Frederick J. Telecky, Jr.

(57) ABSTRACT

Interleaved analog to digital converter with compensation for parameter mismatch among individual converters. A reference ADC samples an input signal at substantially the same time instances as an individual converter used in the interleaved ADC. The reference values provided by the reference ADC are compared with the digital codes generated by the converter to generate an error value from which estimates of the gain, DC offset and timing errors are computed using statistical techniques. Timing error thus estimated is used to change the phase of the sampling clock provided to the converter, and the gain and DC offset errors estimated are applied to modify the values of reference voltages applied to the converter, thus compensating for parameter mismatches.

25 Claims, 5 Drawing Sheets

INTERLEAVED ANALOG TO DIGITAL CONVERTER WITH COMPENSATION FOR PARAMETER MISMATCH AMONG INDIVIDUAL CONVERTERS

RELATED APPLICATION

The present application is related to and claims priority from co-pending U.S. provisional application Ser. No. 60/696,248, filed: Jul. 1, 2005, entitled, "Parameter mismatch correction for a parallel interleaved ADC", naming Jaiganesh Balakrishnan as the first inventor, and is incorporated by reference in its entirety herewith.

BACKGROUND

1. Field of the Invention

The present invention relates generally to design of analog to digital converters, and more specifically to an interleaved analog to digital converter with improved compensation for parameter mismatch among individual converters.

2. Related Art

An analog to digital converter (ADC) refers to a component, which samples an input signal, and provides (generates) digital codes corresponding to the strength of the analog signal at the sampled time instances. A sampling clock is generally provided as an input to the ADC that determines the time instances.

An interleaved ADC refers to a component which employs multiple ADCs (each referred to as a converter henceforth) typically connected in parallel, with each converter sampling the signal generally at a same rate (or frequency), but offset in time with respect to each other in a cyclical fashion. Thus, for example, assuming equal time offset (a) for sampling, in an arrangement containing three ADCs, the first ADC samples the signal at a time instance t, the second ADC at a time instance t+a, the third ADC at a time instance t+2a, and the cycle repeats again. The samples generated by the converters are provided as the output stream of the interleaved ADC.

As may be readily appreciated, an interleaved ADC effectively provides a higher sampling rate by interleaving the input samples across multiple converters. The implementation of each ADC is also simplified since more time is available to provide the corresponding sample.

It is generally desirable that all the converters of an interleaved ADC have identical performance parameters (parameter values) since it would ensure that the stream of generated digital codes would accurately represent the shape of the input signal. A mismatch is said to have occurred if parameters are not identical among the converters.

One type of parameter mismatch is gain mismatch. A gain mismatch is present when all converters contained in an interleaved ADC do not each have the same gain in the amplifier stage. In general, amplifiers with higher gains would generate higher values of digital codes, for the same strength of the sampled input signal.

Another type of parameter mismatch is DC offset mismatch. ADC offset mismatch is present when all converters in the interleaved ADC do not each have the same DC offset error, which may be measured as the digital code generated when the input signal has a strength (voltage) of zero volts. For example, a higher DC offset would imply higher values to be generated assuming positive DC offset.

Yet another type of parameter mismatch is sampling time mismatch due to sampling time (timing) errors. A sampling time mismatch is present when sampling time instances of the individual converters are not all separated in time by equal amounts. As noted above, in an ideal interleaved ADC, the sampling instances of individual converters need to occur at time intervals separated equally in time.

Accordingly, there have been several prior attempts to compensate for parameter mismatches.

In one prior approach, the interleaved ADC is placed in a calibration mode, and the individual converters are fed with a test signal to estimate the mismatch parameters. This approach requires additional hardware for generating the test signal and also requires a calibration phase during which the ADC cannot be used for data conversion. Further, this approach does not allow for tracking parameter mismatch variations (e.g., due to temperature), which might occur during operation over an extended period of time.

The present invention provides a method and apparatus for compensating for parameter mismatch among individual converters in an interleaved ADC, and overcomes at least some of the drawbacks associated with prior approaches.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, a reference ADC provided in an interleaved ADC generates reference values of an input signal by sampling the input signal at substantially the same time instances as a converter contained in the interleaved ADC generates digital codes of the input signal. The parameters of the converters may then be adjusted to minimize mismatch with the corresponding parameters of the reference ADC. By similarly adjusting the parameter values of all converters, mismatch between the converters is reduced.

Due to such an operation, the parameter mismatches can be adjusted in parallel to generating the digital codes representing the input signal. The parameter mismatches can thus be reduced without using special test signals.

The gain, DC offset and timing errors are estimated using statistical techniques by comparing the reference values from the reference ADC and the digital codes from the converter. Gain and DC offset correction factors are provided to correct for such errors in the converter by changing the reference voltages provided to the converter. The timing correction factor is applied to shift the phase of the sampling clock provided to the converter.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

2. Example Device/System

Figure 1:
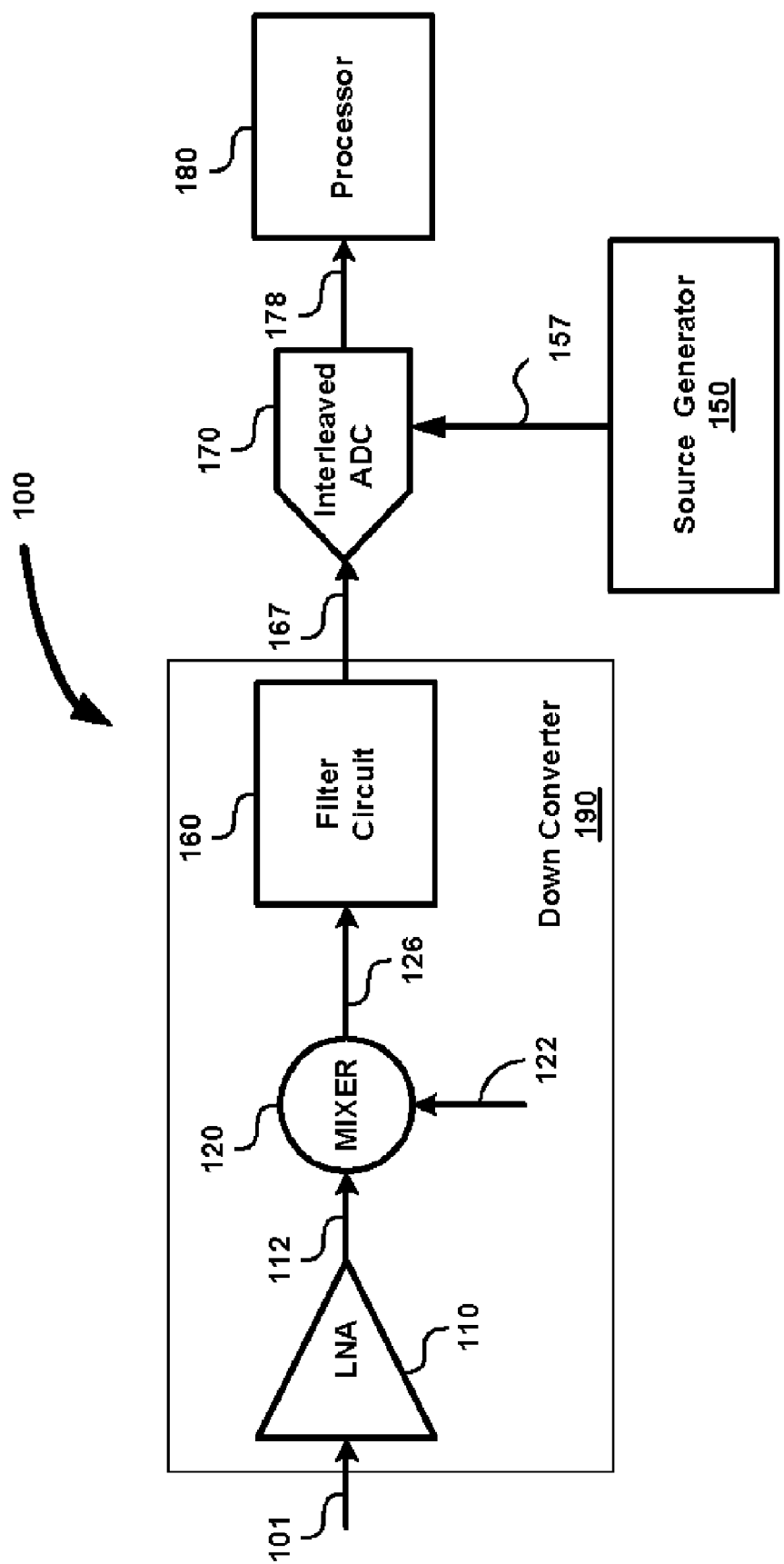
FIG. 1 is a block diagram of an example device/system in which various aspects of the present invention can be implemented

FIG. 1 is a block diagram of an example device in which various aspects of the present invention can be implemented. The diagram shows a receiver system 100 containing source generator 150, interleaved ADC (analog to digital converter) 170, down converter (190), and processor 180. Each block/stage is described in further detail below.

Down converter 190 receives an external signal on path 101 and provides a down converted (in frequency) signal on path 167 to interleaved ADC 170, and is shown containing LNA (low noise amplifier) 110, mixer 120 and filter circuit 160. LNA 110 receives signals on path 101 and amplifies the received signals to generate a corresponding amplified signal on path 112. For example, in a cable TV receiver the signals that are transmitted by a cable TV service provider may be received through a cable (not shown), and the received signals are provided on path 101. The received signals may be weak in strength and thus amplified by LNA 110 for further processing. LNA 110 may be implemented in a known way.

Mixer 120 down-converts the received amplified signal on path 112 into an intermediate signal with the frequency band of interest centered at a lower frequency than the carrier frequency of the received signal. Mixer 120 may receive the amplified signal on path 112 and a signal of fixed frequency on path 122 as inputs, and provides the intermediate signal on path 126. The signal of fixed frequency on path 122 may be generated by a phase locked loop (not shown) in a known way.

Filter circuit 160 may correspond to a low pass filter, which allows the desired low frequencies and rejects all other unwanted high frequencies present in the signal received on line 126. The filtered signal, which contains the frequency band of interest, is provided on path 167 as an input signal to interleaved ADC 170.

Processor 180 processes the received digital codes to provide various user applications and may be implemented as multiple processing units, each potentially operating independently. Source generator 150 provides on path 157 a master clock signal used for the operation of ADC 170.

Interleaved ADC 170 converts (samples) the down-converted signals received on path 167 to provide a digital representation ("digital codes") of signals received on path 101 to processor 180 on path 178. As noted above, interleaved ADCs contain multiple converters internally, and it is generally desirable that all the converters have identical performance parameters since it would ensure that the generated digital codes would accurately represent the shape of the input signal. The description is accordingly continued with the details of an interleaved ADC that address at least some of the issues noted above according to various aspects of the present invention.

3. Interleaved ADC

Figure 2:
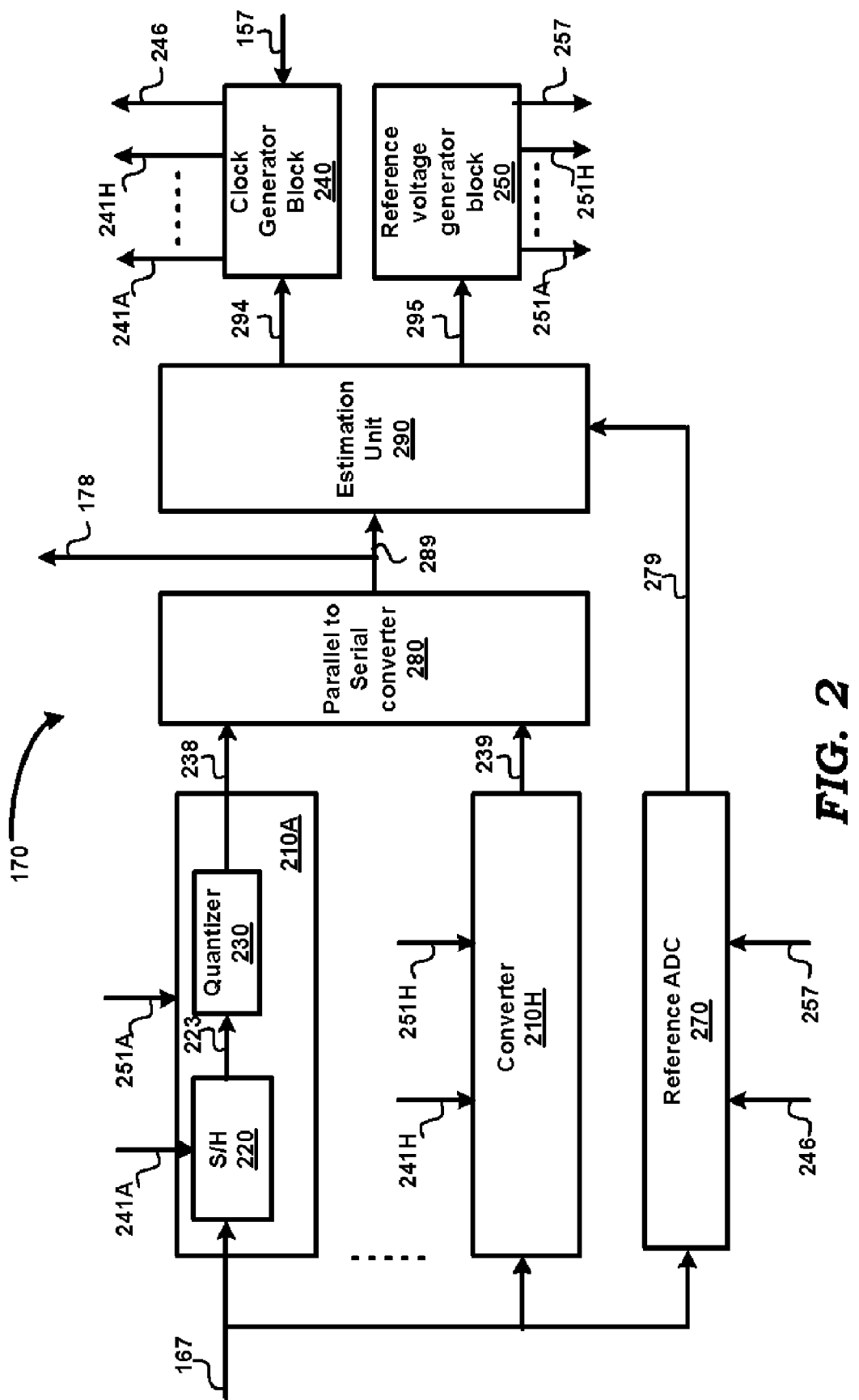
FIG. 2 is a block diagram illustrating the details of an interleaved ADC in an embodiment providing various features according to some aspects of the present invention.

FIG. 2 is a block diagram of interleaved ADC 170 of FIG. 1 in an embodiment of the present invention, illustrating how compensation is provided for parameter mismatch according to some aspects of the present invention. Interleaved ADC 170 is shown containing converters 210A-210H, clock generator block 240, reference voltage generator block 250, reference ADC 270, parallel-to-serial converter 280, and estimation unit 290. Interleaved ADC 170 receives an input signal on path 167, and provides a digital representation (code) of the input signal on path 178/289. Each component/block is described in greater detail below.

Converter 210A contains sample-and-hold amplifier (S/H) 220 and quantizer 230. S/H 220 receives the input signal on path 167, and a sampling clock on path 241A. S/H 220 samples the input signal on path 167 at time instances specified by sampling clock 241A, and provides the voltage of the sampled signal on path 223. The sampled signal is held (maintained) for an interval of time needed for further processing by quantizer 230. Quantizer 230 generates a digital code representing the magnitude of the voltage present on path 223, and provides the digital code on path 238. Converter 210A also receives two reference voltages (one positive and the other negative) required for normal operation on path 251A.

Converters 210B-210H contain similar internal components as converter 210A and operate to provide on corresponding paths (only path 239 corresponding to converter 210H is shown) digital codes representing the input signal (path 167) at time instances specified by corresponding sampling clocks (only 241H is shown). Each of converters 210B-210H also receives on corresponding paths (only 251H corresponding to converter 210H is shown) two reference voltages (one positive and the other negative) required for normal operation in the described embodiment(s).

Parallel to serial converter 280 receives the (subset of) digital codes from converters 210A-210H on corresponding paths (only paths 238 and 239 are shown), and converts the parallelly received (subset of) digital codes into a serial stream of digital codes which is forwarded on path 289 to estimation unit 290. Parallel to serial converter 280 also forwards the serial stream of digital codes on path 178 to a computing device (such as a digital signal processor, not shown) on path 178 for further processing.

Reference ADC 270 operates to provide on path 279 reference values representing the input signal at time instances specified by a reference clock received on path 246. Reference ADC 270 also receives on path 257 two reference voltages (one positive and the other negative) required for operation. Converters 210A-210H may be implemented in a known way. Reference ADC 270 may be implemented as a low-speed, high precision ADC.

Clock generator block 240 receives a master clock on path 157, and provides sampling clocks for converters 210A-210H on corresponding paths 241A through 241H, and a reference clock for reference ADC 270 on path 246. Clock generator block 240 may contain clock dividing and phase shifting circuitry internally (not shown) to generate sampling clocks 241A through 241H and reference clock 246 that have a desired phase/frequency relationship. Further, clock generator block 240 receives correction factors on path 294 for controlling the phase of clocks 241A through 241H to compensate for timing mismatch between these clocks according to several aspects of the present invention, as further described later below.

Reference voltage generator block 250 provides positive and negative reference voltages required by converters 210A-210H on paths 251A through 251H, and for reference ADC 270 on path 257 for operation. Reference voltage generator block 250 also receives correction parameters on path 295 for controlling the positive and negative reference voltages provided on paths 251A through 251H to compensate for gain and DC offset mismatch between converters 210A-210H, as further described below. The implementation of clock generator block 240 and reference voltage generator block 250 consistent with the requirements of other blocks will be apparent to one skilled in the relevant arts by reading the disclosure provided herein.

Alternatively, other techniques/circuitry may be employed to correct for gain and DC offset errors. For example, gain of sample and hold amplifier (example, S/H 220 of converter 210A) may be varied to correct for a gain error, and offset error may be corrected by providing a feedback from a digital-to-analog converter (not shown) driven by digital inputs corresponding to the DC offset correction term.

Estimation unit 290 processes the digital codes received on path 289 and provides correction factors to clock generator block 240 on path 294, and reference voltage generator block 250 on path 295. The correction factors are used by clock generator block 240 and reference voltage generator block 250 to correct for parameter mismatch between converters 210A-210H as described with examples in sections below. Estimation unit 290 may be implemented in a combination of one or more of hardware/software/firmware.

Thus, interleaved ADC 170 contains an estimation unit 290, which receives the digital codes generated by individual converters and from a reference ADC, and estimates the correction factors required to compensate for parameter mismatch. The correction factors are provided to clock generator block 240 and reference voltage generator block 250 to compensate for timing, gain and DC offset mismatch.

The manner in which estimation unit 290 processes the digital codes received from individual converters and a reference converter to generate correction factors is described in detail below after a brief description of the sampling clocks and reference clock and their phase/frequency relationship.

4. Sampling Clocks and Reference Clock

Figure 3:
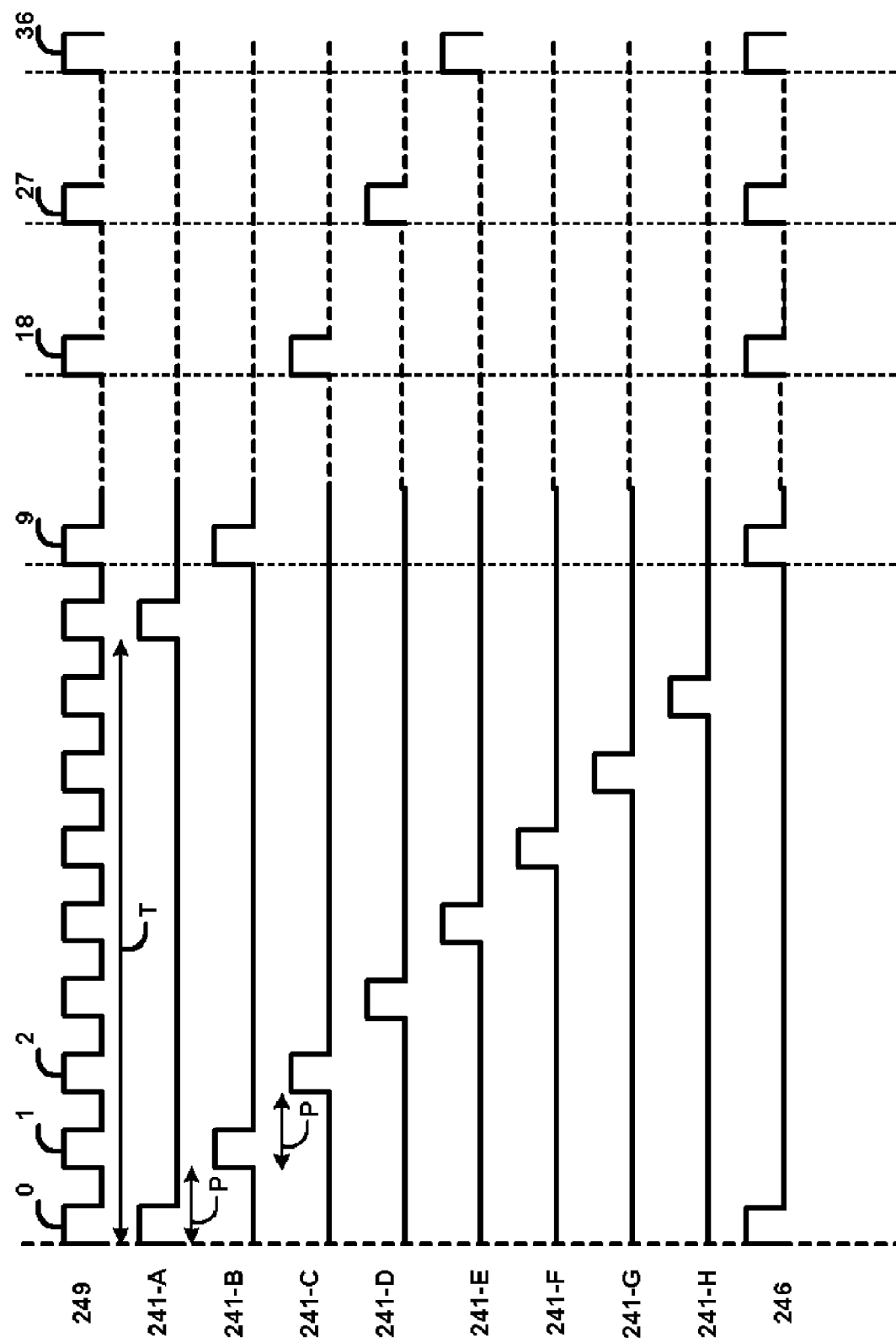
FIG. 3 is a timing diagram illustrating an example relationship among the master clock, sampling clocks and the reference clock in an embodiment of an interleaved ADC according to various aspects of the present invention.

FIG. 3 is a timing diagram illustrating an example relationship between master clock 249, and sampling clocks 241A through 241H, and reference clock 246 generated by clock generator block 240 of FIG. 2.

Each of sampling clocks 241A through 241H is obtained by dividing master clock 249 by a same number, and successively providing a desired phased offset to each sampling clock. In an embodiment of the present invention the desired phase difference is set equal to the period of any of the sampling clocks divided by the total number of converters. In the timing diagram of FIG. 3, each of sampling clocks 241A through 241H is obtained by dividing master clock 249 by eight, and the phase offset (P) is equal time period T divided by eight.

As may be seen from FIG. 3, each of sampling clocks 241A through 241H pulses (has an active/sampling edge) at a corresponding (and different) phase of master clock 249. Thus, 241A is active at interval 0, 241B is active at interval 1, 241C is active at interval 2, and so on.

Reference clock 246 is obtained by dividing master clock 249 by a number that is coprime with the divide number used for obtaining sampling clocks 241A through 241H, i.e., the divide numbers for obtaining the sampling clocks and reference clock must not have any common factors other than 1. In the timing diagram of FIG. 3, reference clock 246 is obtained by dividing master clock 249 by nine.

As may be readily verified by calculation, due to the choice of coprime divide numbers reference clock 246 is active at intervals 0, 9, 18, 27, 36 etc. Thus, the active edges of reference clock 246 occur substantially simultaneously with the active edges of the sampling clocks 241A through 241H in a cyclic fashion.

The timing diagram of FIG. 3 shows the sampling edges of reference clock 246 coinciding with the sampling edges of sampling clocks 241A, 241B, 241C, 241D and 241E at time intervals 0, 9, 18, 27 and 36 respectively. Though not shown, it may be readily verified that the sampling edges of reference clock 249 would coincide with the sampling edges of sampling clocks 241F, 241G, and 241H at time intervals 45, 54 and 63 respectively. The cycle repeats again with sampling edge of reference clock 246 coinciding with the sampling edge of sampling clock 241A at time interval 72.

Therefore, both converter 210-A and reference ADC 270 provide a sample (a digital code and a reference value respectively) of input signal 167 at time interval 0. Similarly, both converter 210-B and reference ADC 270 provide a sample (a digital code and a reference value respectively) of input signal 167 at time interval 9, and so on. Thus, it may be appreciated that over a period of time a subset of digital codes generated by sampling input signal 167 substantially at the same time instances as at reference ADC 270 are obtained from each of converters 210A-210H. This is further clarified below with respect to FIG. 4.

5. Digital Codes and Reference Values

Figure 4:
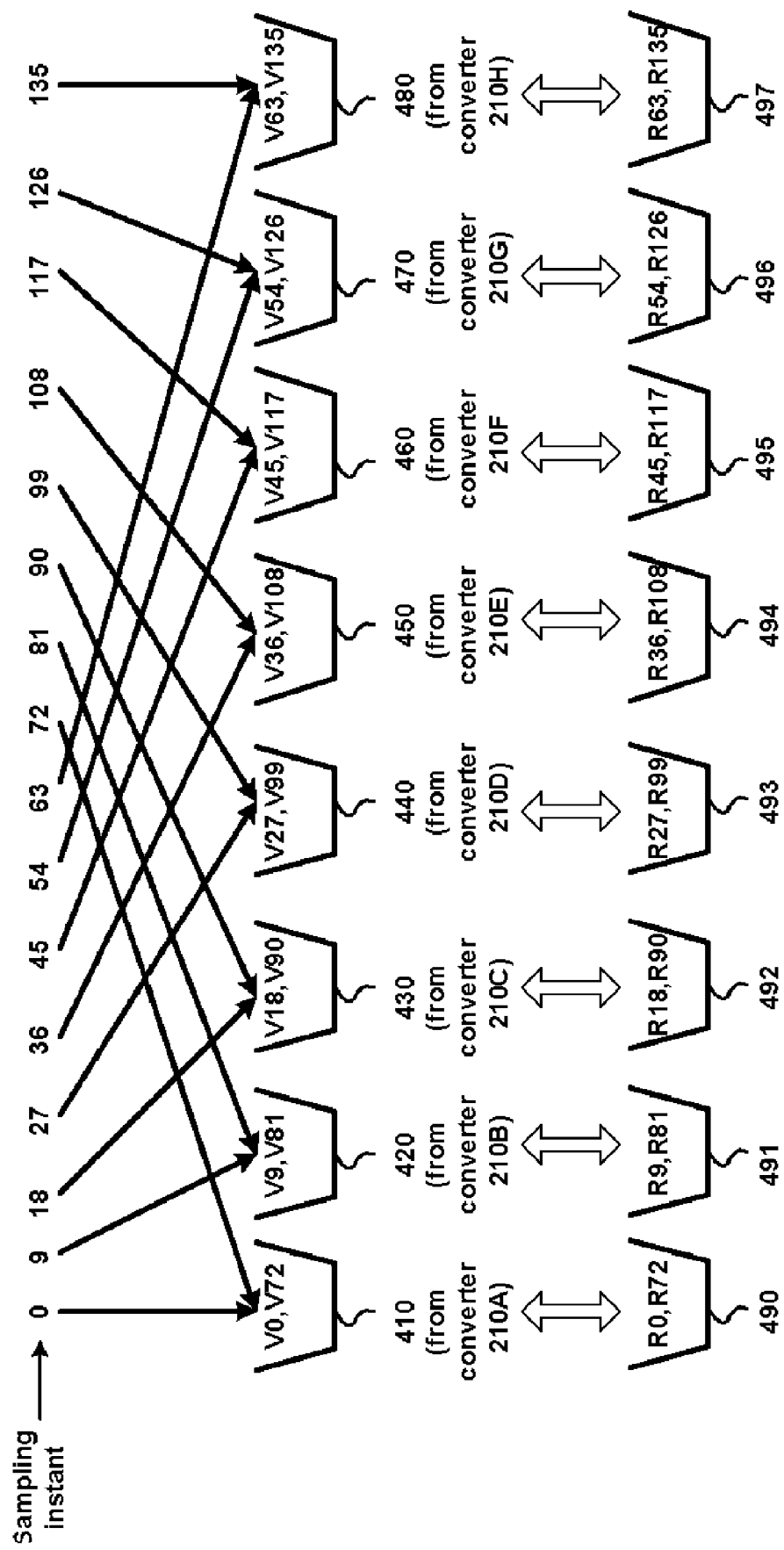
FIG. 4 is a diagram illustrating pictorially the sequence in which digital codes from each converter and the corresponding reference values from a reference ADC are obtained in an embodiment of an interleaved ADC according to various aspects of the present invention.

FIG. 4 is a diagram illustrating pictorially the sequence in which digital codes from each converter 210A-210H, and the corresponding reference values from reference ADC 270 are obtained. Only two complete sampling cycles are shown for conciseness. References are made to FIG. 2.

410 represents the digital codes (v0 and v72) generated by (obtained from) converter 210A at time (sampling) instances 0 and 72. Similarly, 420, 430, 440, 450, 460, 470 and 480 represent the digital codes generated by converters 210-B through 210H respectively at corresponding sampling instances as indicated in FIG. 4. Thus, each of 410 through 480 contains a subset of digital codes, with each subset obtained from a corresponding one of converters 210A through 210H.

It may also be appreciated from the description given above that reference ADC 270 also generates reference values (R0 and R72) of input signal 167 at sampling instances 0 and 72, as represented by 490 in FIG. 4. Similarly, each of 491 through 497 contains a corresponding subset of reference values (obtained by sampling input signal 167), with each subset of reference values obtained from a corresponding one of converters 210A through 210H at corresponding sampling instances.

Although only two complete sampling cycles are shown, it must be understood that each of subsets 410, 420, 430, 440, 450, 460, 470 and 480 and 490-497 would contain more than two digital codes/reference values. Since reference ADC 270 is a high precision converter the reference values obtained may be considered to be a precise representation of input signal 167, and may be used by comparing with the corresponding reference codes obtained from converters 210A-210H to estimate the correction factors for parameter mismatch.

Thus, for example, the subset of digital codes 410 generated by converter 210A may be compared with the subset of reference values 490 to make an estimation of the errors (and generate correction factors for) in converter 210A. Similarly, each of subsets of digital codes contained in 420, 430, 440, 450, 460, 470 and 480 may be compared with reference values in subsets 491-497 to make an estimation of the errors (and generate correction factors for) in converters 210B-210H.

Such correction factors can be generated in one of several known ways (once the set of digital codes for comparison are identified), as will be apparent to one skilled in the relevant arts by reading the disclosure provided herein. The manner in which the correction factors for gain, DC offset, and timing mismatch among converters 210A-210H are generated in an example embodiment is described in detail below.

6. Processing Codes for Correcting Mismatches

Figure 5:
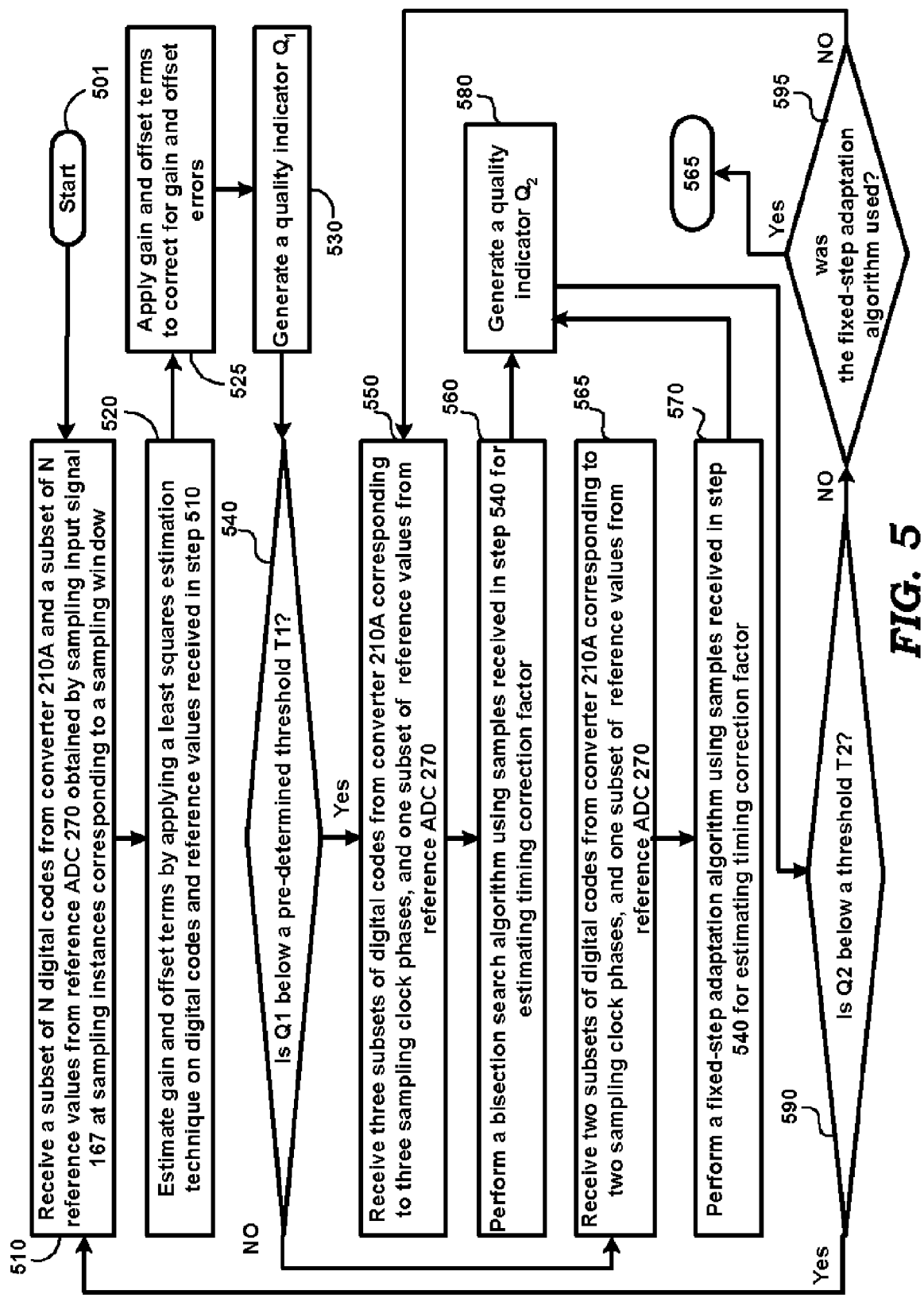
FIG. 5 is a flow chart illustrating the manner in which correction factors for gain, DC offset, and timing errors are generated for each converter contained in an embodiment of an interleaved ADC according to various aspects of the present invention.

FIG. 5 is a flow chart illustrating the manner in which correction factors for gain, DC offset, and timing mismatch are generated for each converter 210A-210H (of FIG. 2). The flow chart is described with respect to converter 210A (and thus the sample in 410 and 490 of FIG. 4). However, the same approaches can be used for converters 210B-210H as well. The flowchart starts in step 501 where control passes immediately to step 510.

In step 510, a subset of N digital codes are received from converter 210A, and a subset of N reference values are received from reference ADC 270, where each digital code and a corresponding reference value have both been obtained by sampling input signal 167 at a (substantially) same sampling instance. With respect to FIG. 4, subsets 410 and 490 are received. Control then passes to step 520.

In step 520, the gain and offset correction factors are estimated using the following equations:

$$a\_new = a\_old/a\_ls \qquad \text{Equation (1)}$$
$$= (2 - a\_ls) * a\_old \text{ (approximately)}$$

$$b\_new = (b\_old - b\_ls)/a\_ls \qquad \text{Equation (2)}$$
$$= (b\_old - b\_ls) * (2 - a\_ls) \text{ (approximately)}$$

wherein:
a_old is the previous estimate of the gain correction.
b_old is the previous estimate of the DC offset correction.
a_new is the new estimate of the gain correction.
b_new is the new estimate of the DC offset correction.
a_ls is the current estimate of the gain error.
b_ls is the current estimate of the DC error.

It may be noted that $1/a\_ls$ may be approximated as $(2-a\_ls)$ since the value of a_ls would be close to unity. Any error due to such an approximation would be corrected during the iterative procedure described below.

Initially (at the first iteration of the algorithm), value of a_old is entered as one, and b_old is entered as zero. New values for the gain and DC offset correction terms are computed by accumulating a sufficient number of digital codes from converter 210A and reference values from reference ADC 270. Specifically, the correction terms a_ls and b_ls are computed using the following equation:

$$\begin{bmatrix} a\_ls \\ b\_ls \end{bmatrix} = \begin{bmatrix} \sum_{k=1}^{N} |s(k)|^2 & \sum_{k=1}^{N} s(k) \\ \sum_{k=1}^{N} s(k) & N \end{bmatrix}^{-1} \begin{bmatrix} \sum_{k=1}^{N} s(k)y(k) \\ \sum_{K=1}^{N} y(k) \end{bmatrix} \quad \text{Equation (3)}$$

wherein:
s(k) represent the magnitudes of the reference values received from reference ADC 270, where k takes on values from 1 to a desired number N.

$|s(k)|^2$ represents the square of the absolute value of the reference values from reference ADC 270.

N is the maximum number of samples of digital codes and reference values used to compute the correction terms.

y(k) represents the (corrected) digital code (path 223 of FIG. 2) from converter 210A without taking into account correction for timing error, which may be represented as given below:

$$y(k) = a\_ls * r(k)_t s \qquad \text{Equation (4)}$$

wherein $r(k)_t$ presents input signal 167, subscript t resenting the timing error (which is also to be estimated and corrected for in steps 560/570 below).

Thus terms a_ls and b_ls are obtained by computations as given above, and the values of the gain and DC offset correction terms (factors) are computed as given by equations 1 and 2.

As may be apparent to one skilled in the relevant arts, that correction terms a_ls and b_ls are determined such that the sum of the squared error values obtained as a difference of a signal represented by the subset of N digital codes and the signal represented by the N reference values received in step 510 is minimized. Thus, a least squares algorithm is used in step 520.

The above operations may, optionally, be repeated for another N samples of digital codes and reference values obtained from a next sampling window (interval), and another set of correction terms are obtained using equations 1 to 4. When multiple iterations are used multiple sets of correction terms for gain and DC offset are obtained (one set from each iteration), which are averaged to provide a desired set of gain and DC offset correction terms using the following equation:

$$R_n^{avg} = \sum_{l=0}^{N_{avg}-1} \rho_l R_{n-l} \text{ and } P_n^{avg} \qquad \text{Equation (5)}$$

$$= \sum_{l=0}^{N_{avg}-1} \rho_l P'_{n-l} \text{ where } P'_n$$

$$= \frac{P_n - R_n \begin{bmatrix} 0 \\ b\_ls_{n-1} \end{bmatrix}}{a\_ls_{n-1}}$$

$$\begin{bmatrix} a\_ls \\ b\_ls \end{bmatrix} = (R_n^{avg})^{-1} \left( a\_ls_{n-1} P_n^{avg} + R_n^{avg} \begin{bmatrix} 0 \\ b\_ls_{n-1} \end{bmatrix} \right)$$

wherein: $R_n$ is a 2×2 auto-correlation matrix with the entries given by $$R_n = \begin{bmatrix} \sum_{k=1}^{N} |s(k)|^2 & \sum_{k=1}^{N} s(k) \\ \sum_{k=1}^{N} s(k) & N \end{bmatrix} \quad \text{Equation (5A)}$$

for the window with index n,
$R_n^{avg}$ is the averaged auto-correlation matrix across multiple iterations,
$\rho_l$ is the $l^{th}$ coefficient used to weight the $R_{n-l}$ values in the computation of the averaged auto-correlation matrix for index n,
$N_{avg}$ is the number of windows(iterations) over which the averaging is performed,
$P_n$ is a 2×1 cross-correlation matrix with the entries given by $$P_n = \begin{bmatrix} \sum_{k=1}^{N} s(k) y_\tau(k) \\ \sum_{k=1}^{N} y_\tau(k) \end{bmatrix} \quad \text{Equation (5B)}$$

for the window with index n,
$P_n'$ is the gain and dc offset compensated cross-correlation matrix used for averaging and is given by $$P_n' = \frac{P_n - R_n \begin{bmatrix} 0 \\ b\_ls_{n-1} \end{bmatrix}}{a\_ls_{n-1}} \quad \text{Equation (5C)}$$

$P_n^{avg}$ is the averaged cross-correlation matrix across update windows,
$a\_ls_n$ is the averaged gain estimate for the $n^{th}$ update window,
$b\_ls_n$ is the averaged dc offset estimate for the $n^{th}$ update window, Thus, the averaged values of a_ls and b_ls are obtained and are provided as the correction factors for gain and DC offset errors respectively, and the estimated optimum input signal is re-computed using equation 4. Control then passes to step 525.

In step 525, the gain and offset correction terms computed in step 520 are applied to correct for gain and offset errors in converter 210A. In an embodiment, correction factors a_ls and b_ls are applied as described in section 7 below.

In step 530, a quality indicator Q1 is computed. Q1 may be computed as either the normalized mean absolute error or the mean squared error between the "corrected" input signal (obtained from converter 210A as result of step 525 above) and the reference values from the reference ADC 270. This is described briefly below:

After correcting for gain and DC offset errors in converter 210A according to step 525, a set of samples from the (now "gain-and DC-offset-corrected") converter 210A, and a corresponding set of reference values from ADC 270 are compared to generate quality indicator Q1.

Q1 may be determined, for example, by computing either the mean absolute error, or the mean squared error between the "corrected" input signal (set of samples from converter 210A after gain and DC offset correction have been applied) and corresponding reference values from reference ADC 270, as given respectively by equations 5D and 5E below.

$$Q1 = \frac{1}{N} \sum_{k=0}^{N-1} |e(k)| \quad \text{Equation (5D)}$$

$$Q1 = \frac{1}{N} \sum_{k=0}^{N-1} |e(k)|^2 \quad \text{Equation (5E)}$$

wherein:
Equation 5A provides the mean absolute error, and equation 5B provides the mean squared error.
e(k) is the difference of an single sample in the set of samples from converter 210A and a corresponding reference value from reference ADC 270.

Alternatively, the number of iterations (of steps 510/520) may be used as a measure to determine Q1.

Control then passes to step 540.

In step 540, quality indicator Q1 obtained in step 530 is compared with a pre-computed threshold T1. In an embodiment, T1 is set to be 1 dB below the best possible mean absolute error (MAEbest) with respect to converter 210A in the presence of quantization and non-linearities effects in converter 210A. If Q1 is less than threshold T1 control passes to step 550, else control passes to step 565.

In step 550, three subsets ("early", "prompt" and "late" subsets/codes) of digital codes are received from converter 210A where each subset is obtained using a corresponding one of three different phases for sampling clock 241A, a phase earlier than the "prompt" phase, a "prompt" phase, and a phase later than the "prompt" phase. A subset of reference values corresponding are also received from reference ADC 270, where reference values have been obtained by sampling input signal 167 at a substantially same sampling instance as used to obtain the digital codes contained in the "prompt" subset.

If the "prompt" subset is obtained using a phase t0 for sampling clock 241A, then on initialization of step 550 (i.e., for the first iteration), t1 and t2 are the phases of sampling clock 241A used to obtain the "early" and "late" subsets, where t1 and t2 are given by equation 6 below:

$$t1 = t0 - t\max$$

$$\text{and } t2 = t0 + t\max \quad \text{Equation (6)}$$

wherein:
tmax is the maximum possible timing (phase) error, which is known a priori from the characteristics of converter 210A.

Control then passes to step 560.

In step 560, a bisection search algorithm is used to estimate the timing correction factor using the samples received in step 540, as further explained below.

A difference (error value) between the signal represented by the early code and the signal represented by the reference values received in step 540 is computed as given below:

$$E\_early(l) = \frac{1}{N}\sum_{k=0}^{N-1} |e\_early(3lN + k)| \quad \text{Equation (7)}$$

A difference (error value) between the signal represented by the prompt code and the signal represented by the reference values received in step 540 is computed as given below:

$$E\_prompt(l) = \frac{1}{N}\sum_{k=0}^{N-1} |e\_prompt((3l + 1) * N + k)| \quad \text{Equation (8)}$$

A difference (error value) between the signal represented by the late code and the signal represented by the reference values received in step 540 is computed as given below:

$$E\_late(l) = \frac{1}{N}\sum_{k=0}^{N-1} |e\_late((3l + 2) * N + k)| \quad \text{Equation (9)}$$

In equations 7, 8 and 9, index "l" represents a window corresponding to 3*N samples, the first N samples being used in computing equation 7, the next N samples being used in computing equation 8, and the last N samples being used in computing equation 9. This may be verified by substituting a value of 0 for l in equations 7, 8 and 9 above.

e_early is the difference between a single sample in the early code and the corresponding sample contained in the reference values.

e_prompt is the difference between a single sample in the prompt code and the corresponding sample contained in the reference values.

e_late is the difference between a single sample in the late code and the corresponding sample contained in the reference values.

K represents a sample index and ranges from 0 to(N−1).

The least two of the error values obtained from equations 7, 8 and 9 above, and the corresponding sampling instances (or phases) are noted. A new sampling instant t3 (or equivalently phase) is computed which is at the mid-point (in time) of the two sampling instances resulting in the two least error values determined above. The new sampling instant t3 thus calculated is used to obtain the "prompt" code for the next iteration. The earlier (in time/phase) of the codes corresponding to the least two error values obtained above is set as the "early" code for the next iteration, and the later of the codes corresponding to the least two error values obtained above is set as the "late" code for the next iteration. A pre-determined number of iterations may be performed. Alternatively, error indicated by the value of E_prompt(l) may be observed, and the iterative process is continued till such error value is below a desired threshold.

The error value of equation 8 and the minimum of the error values obtained from equations 7 and 9 above, and the corresponding sampling instances (or phases) are noted. A new sampling instant t3 (or equivalently phase) is computed which is at the mid-point (in time) of the two sampling instances resulting in the two least error values determined above. The new sampling instant t3 thus calculated is used to obtain the "prompt" code for the next iteration. The earlier (in time/phase) of the codes corresponding to the least two error values obtained above is set as the "early" code for the next iteration, and the later of the codes corresponding to the least two error values obtained above is set as the "late" code for the next iteration. A pre-determined number of iterations may be performed. Alternately, error indicated by the value of E_prompt(l) may be observed, and the iterative process is continued till such error value is below a desired threshold.

The value of the phase shift (t) obtained at the end of the procedure described above (i.e., after the final iteration) is provided as the correction factor for timing error.

Thus, effectively, the timing correction factor is estimated (obtained) by time shifting the sampling clock to generate early, prompt and late subsets of digital codes, and computing error values in each case, as described above. This procedure is performed in an iterative manner to minimize the error value.

Control then passes to step 580.

In step 565, two subsets ("prompt", and "late" or "early" subsets/codes) of digital codes are received from converter 210A where each subset is obtained using a corresponding one of two different phases for sampling clock 241A, a "prompt" phase, and a phase earlier (or later) than the "prompt" phase. A subset of reference values are also received from reference ADC 270, where reference values have been obtained by sampling input signal 167 at a substantially same sampling instance as used to obtain the digital codes contained in the "prompt" subset. Control then passes to step 570.

In step 570, a fixed-step adaptation algorithm is used to estimate the timing correction factor using the samples received in step 565, as further explained below. Only two subsets of digital codes, either early and prompt, or late and prompt subsets are used. The prompt subset corresponds to a phase offset of zero (and a corresponding time t), and the late (early) subset corresponds to a phase offset of Δt (−Δt). Thus, the prompt subset may be considered to correspond to a time t, and the early (late) subset to a time t−Δt (t+Δt).

A difference (error value) between the signal represented by the prompt code and the signal represented by the reference values received in step 540 is computed as given below:

$$J\_prompt(l) = \frac{1}{N}\sum_{k=0}^{N-1} |e\_prompt((2l)N + k)| \quad \text{Equation (10)}$$

A difference (error value) between the signal represented by the early (or late) code and the signal represented by the reference values received in step 540 is computed as given below:

$$J\_late(l) = \frac{1}{N}\sum_{k=0}^{N-1} |e\_late((2l + 1)N + k)| \quad \text{Equation (11)}$$

wherein:

e_prompt is the difference between a single sample in the prompt code and the corresponding sample contained in the reference values.

e_late is the difference between a single sample in the late code and the corresponding sample contained in the reference values.

Index "l" represents a window corresponding to 2*N samples, the first N samples being used in computing equation 10, and the next N samples being used in computing equation 11.

If J_prompt(l) is greater than J_late(l), then t is set as t+Δt, and error values as given by equations 10 and 11 are re-computed, corresponding to new prompt phase (t+Δt) and new late phase (t+2*Δt).

If J_prompt(l) is lesser than J_late(l) then Δt is set as −t, and error values as given by equations 10 and 11 are re-computed, corresponding to current prompt phase t and new late phase (t−Δt).

The iteration using equations 10 and 11 are continued with the time increment t being changed for the next iteration, as described above. A pre-determined number of iterations may be performed. The value of the total phase shift to the prompt code obtained after a pre-determined number of iterations, and which corresponds to a lowest value of error signal J_prompt, is provided as the correction factor for timing error.

Thus, effectively, the timing correction factor is estimated (obtained) by time shifting the sampling clock to generate early (late) and prompt subsets of digital codes, and computing error values in each case, as described above. This procedure is performed in an iterative manner to minimize the error value. Control then passes to step 580.

In step 580, a quality indicator Q2 is computed. Q2 may be computed as either the normalized mean absolute error or the mean squared error between the (samples of) input signal 167 obtained after applying correction for timing error (as result of steps 560 or 570 above) and the reference values from the reference ADC 270. The computation of Q2 may be similar to the description provided with respect to step 530 and equations 5A and 5B given above, and is not repeated here in the interest of conciseness.

Q2 may also be determined based on the computations performed during the estimation of the timing error (steps 550/570), without having to obtain samples from the "timing corrected" converter 210A. Alternatively, the number of iterations (of steps 550/560 or 565/570) may be used as a measure to determine Q2. Control then passes to step 590.

In step 590, Q2 is compared with a threshold T2. In an embodiment, T2 is set to be 0.5 dB below the best possible mean absolute error (MAEbest) in the presence of quantization and non-linearities effects in converter 210A. If Q2 is less than threshold T2, control passes to step 510, where the procedures according to the flowchart are repeated again. If Q2 is greater than threshold T2 control passes to step 595.

In step 595, it is determined whether control was provided to this step via the "bisection search" step of 560, or the "fixed-step adaptation algorithm" step of 570. If control was provided via step 560, control now passes to step 550, else control passes to step 565.

In the flow chart description given above the step of 520 was described as using a least squares estimation algorithm for determining (estimating) the correction factors for gain and DC offset for fast convergence. However, step 520 may optionally use a slower least mean squared (LMS) algorithm for the same estimation when fast convergence is not required, and as described below.

Correction terms c (gain correction) and d (DC offset correction) are computed in an iterative fashion using equations 12 and 13:

$$c\_new = c\_old + \mu * e(k) * r(k) \quad \text{Equation (12)}$$
$$= c\_old + \mu * e(k) * y(k)$$

$$d\_new = d\_old + Y * e(k) \quad \text{Equation (13)}$$

wherein:
c_old is the previous estimate of the gain correction.
c_new is the new estimate of the gain correction.
d_old is the previous estimate of the DC offset correction.
d_new is the new estimate of the DC offset correction.
e(k) is the difference between the signal represented by the digital codes and that represented by the reference values.
μ is a desired step size, which determines the speed at which the LMS algorithm converges.
Y is a desired step size, which determines the speed at which the LMS algorithm converges.
K represents a particular iteration using a single digital code from converter 210A and a corresponding single reference value from reference ADC 270.
r(k) is the input signal 167.
y(k) is the desired (and corrected) signal on path 223 represented by the digital codes received from converter 210A.

Initial values of c_old and d_old are set to values of one and zero respectively. The above procedure with computation using equations 12 and 13 is repeated for a pre-determined number of iterations, or till the error value computed in step 530 falls below a desired value. The values of c_new and d_new obtained at the final iteration are provided as the correction factors for gain and DC offset respectively.

The flow chart of FIG. 5 described above may be used with modifications in the sequence of steps, or without one or more steps. For example, the steps of 520 and 560 (or 570) may be completely frozen (i.e., not repeated) if quality indicators Q1 and/orQ2 exceed a desired threshold, and restarted if Q1 and/or Q2 fall below such a threshold at a later point in time. Steps 550-595 (used to estimate the timing error) may optionally not be used, and only gain and DC offset errors may be estimated. Step 520 may be switched between a least squares method and a least mean squares method in alternate iterations.

The flow chart of FIG. 5 described the manner in which the correction factors estimated, and applied to correct for gain, DC offset and timing errors. The manner in which such corrections may be applied is described below.

7. Applying the Correction Factors to Correct for Errors

Correction factors a_ls (or c), b_ls (or d) and t obtained from the algorithms described above with respect to the flowchart of FIG. 5 are applied to correct for the errors as described below.

The positive and negative reference voltages +Vref and −Vref provided to converter 210A are modified by division by a factor a_ls (or c) to correct for gain error. The positive and negative reference voltages +Vref and −Vref provided to converter 210A, are modified by subtracting by a factor b_ls (or d) to correct for DC offset error.

Thus gain and DC offset errors are compensated by modifying +Vref and −Vref as given below:

(+Vref/a_ls) −b_ls is provided instead of +Vref.

(−Vref/a_ls) −b_ls is provided instead of −Vref.

The timing correction factor t represents a phase shift required in the sampling clock 241A provided to the sample and hold amplifier (S/H) 220 (shown in FIG. 2).

Such a phase shift may be provided within clock generator block 240 by providing corresponding scaling factors to sine and cosine waveforms used to generate sampling clock 241A, as given by equation 15 below:

$$A*\cos(wt) + B*\sin(wt) = \text{Sqrt}\,[(a^2+b^2)]*\sin\{wt + \arctan(A/B)\} \quad \text{Equation 14}$$

wherein:

A and B are the required scaling factors, where arctan(A/B) equals the timing correction factor.

8. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An interleaved ADC generating a plurality of digital codes representing an input signal, said interleaved ADC comprising:

a plurality of converters, with each of said plurality of converters sampling said input signal at time points specified by a corresponding one of a plurality of sampling clocks to generate a subset of digital codes, wherein said plurality of sampling clocks operate at different phases, wherein each of said subset of digital codes is comprised in said plurality of digital codes, wherein a magnitude of each of said digital codes depends on a parameter value of the corresponding converter;

a reference converter also sampling said input signal at time points specified by a reference clock and generating a plurality of reference values; and an estimation unit examining said plurality of reference values and said plurality of subset of digital codes generated by a first converter contained in said plurality of converters, and generating a correction factor to change said parameter value of said first converter.

2. An interleaved ADC generating a plurality of digital codes representing an input signal, said interleaved ADC comprising:

a plurality of converters, with each of said plurality of converters sampling said input signal at time points specified by a corresponding one of a plurality of sampling clocks to generate a subset of digital codes, wherein said plurality of sampling clocks operate at different phases, wherein each of said subset of digital codes is comprised in said plurality of digital codes, wherein a magnitude of each of said digital codes depends on a parameter value of the corresponding converter;

a reference converter also sampling said input signal at time points specified by a reference clock and generating a plurality of reference values; and an estimation unit examining said plurality of reference values and said plurality of subset of digital codes, and generating a correction factor to compensate for a mismatch in the parameter value of a first converter contained in said plurality of converters, wherein said estimation unit computes a difference of a first code contained in a first subset of digital codes and a second code contained in a second subset of reference values in said examining, wherein said first subset of digital codes is contained in said plurality of subset of digital codes and generated by said first converter, and said second subset of reference values are contained in said plurality of reference values.

3. The interleaved ADC of claim 2, wherein said reference clock and a first sampling clock are generated such that said first code and said second code are obtained by sampling said input signal at substantially the same instant in time, wherein said first sampling clock determines the time points at which said first converter samples said input signal.

4. The interleaved ADC of claim 3, wherein each of said plurality of sampling clocks is generated by dividing a master clock signal of a higher frequency with a divider number, but from a different phase of said master clock signal, wherein said reference clock is generated by dividing said master clock signal by a co-prime number in relation to said divider number.

5. The interleaved ADC of claim 4, wherein said plurality of reference values comprise a plurality of subset of reference values, wherein each of said plurality of subset of reference values is used by said estimation unit to generate the correction factor for a corresponding one of said plurality of converters.

6. The interleaved ADC of claim 5, wherein said parameter value relates to a gain error and a DC offset error, said estimation unit generating a gain correction term and a DC offset correction term such that a metric derived from error values obtained as a difference of a first signal represented by a first group of codes contained in said first subset of digital codes and a second signal represented by a second group of reference values contained in said second subset of reference values is minimized.

7. The interleaved ADC of claim 6, wherein said metric represents the sum of the square of the magnitudes of said error values.

8. The interleaved ADC of claim 6, wherein said metric represents the average of the sum of the square of the magnitudes of said error values.

9. The interleaved ADC of claim 5, wherein said parameter value relates to a sampling time error, said estimation unit generating a timing correction term, wherein said estimation unit generates said timing correction term by subtracting a third signal represented by a fifth group of codes contained in said first subset of digital codes and a fourth signal represented by a sixth group of reference values contained in said second subset of reference values to yield a second error value, wherein said fifth group of codes is obtained by time shifting the sampling clock by a first magnitude.

10. The interleaved ADC of claim 9, wherein said estimation unit subtracts a fifth signal represented by a seventh group of codes contained in said first subset of digital codes from said fourth signal, wherein said fifth signal is obtained by time shifting the sampling clock by a second magnitude to generate a third error value, said estimation unit subtracting a sixth signal represented by an eighth group of codes contained in said first subset of digital codes from said fourth signal to generate a fourth error value, wherein said sixth signal is generated without time shifting the sampling clock, wherein said estimation unit time shifts the sampling clock by a value which is between the time shifts corresponding to the two minimum values of said second error value, said third error value and said fourth error value.

11. The interleaved ADC of claim 9, wherein said estimation unit subtracting a seventh signal represented by a ninth group of codes contained in said first subset of digital code from said fourth signal to generate a fifth error value,
wherein said seventh signal is generated without time shifting the sampling clock,
wherein said estimation unit applies a fixed step approach using said second error value and said fifth error value to time shift the sampling clock to align the sampling clock with said reference clock.

12. A method of generating a plurality of digital codes representing an input signal, said method being performed in an interleaved analog to digital converter (ADC) containing a plurality of converters, said method comprising:
sampling a portion of said input signal at different time instances using said plurality of converters to generate a first plurality of digital codes, wherein each of said plurality of converters generates a corresponding one of a plurality of subset of digital codes, said plurality of subset of digital codes together forming said first plurality of digital codes;
sampling said portion at the same time instances as sampled by a first converter to generate a set of reference values, wherein said first converter is contained in said plurality of converters and said plurality of subset of digital codes contains a first subset of digital codes generated by said first converter;
computing a difference of signals representing said set of reference values and said first subset of digital codes;
estimating a correction factor to compensate for mismatch of a parameter of said first converter; and
correcting the parameter corresponding to said first converter,
wherein a magnitude of each of said digital codes depends on a value of said parameter of said first converter and wherein said correcting changes said value,
whereby said first converter operates with said corrected parameter in sampling future portions of said input signal after said correcting, and wherein said plurality of digital codes are generated in parallel to correcting said parameter.

13. The method of claim 12, wherein said parameter comprises one of a gain, a DC offset and a timing of said first converter.

14. A device comprising:
a processor processing a plurality of digital codes; and
an interleaved ADC generating said plurality of digital codes representing an input signal, said interleaved ADC comprising:
a plurality of converters, with each of said plurality of converters sampling said input signal at time points specified by a corresponding one of a plurality of sampling clocks to generate a subset of digital codes, wherein said plurality of sampling clocks operate at different phases, wherein each of said subset of digital codes is comprised in said plurality of digital codes, wherein a magnitude of each of said digital codes depends on a parameter value of the corresponding converter;
a reference converter also sampling said input signal at time points specified by a reference clock and generating a plurality of reference values; and
an estimation unit examining said plurality of reference values and said plurality of subset of digital codes generated by a first converter contained in said plurality of converters, and generating a correction factor to change said parameter value of said first converter.

15. The device of claim 14, further comprising a down-converter converting a high frequency signal to a lower frequency signal, wherein said input signal is comprised in said lower frequency signal.

16. A device comprising:
a processor processing a plurality of digital codes; and
an interleaved ADC generating said plurality of digital codes representing an input signal, said interleaved ADC comprising:
a plurality of converters, with each of said plurality of converters sampling said input signal at time points specified by a corresponding one of a plurality of sampling clocks to generate a subset of digital codes, wherein said plurality of sampling clocks operate at different phases, wherein each of said subset of digital codes is comprised in said plurality of digital codes, wherein a magnitude of each of said digital codes depends on a parameter value of the corresponding converter;
a reference converter also sampling said input signal at time points specified by a reference clock and generating a plurality of reference values; and
an estimation unit examining said plurality of reference values and said plurality of subset of digital codes, and generating a correction factor to compensate for mismatch in the parameter value of a first converter contained in said plurality of converters,
wherein said estimation unit computes a difference of a first code contained in a first subset of digital codes and a second code contained in a second subset of reference values in said examining, wherein said first subset of digital codes is contained in said plurality of subset of digital codes and generated by said first converter, and said second subset of reference values are contained in said plurality of reference values.

17. The device of claim 16, wherein said reference clock and a first sampling clock are generated such that said first code and said second code are obtained by sampling said input signal at substantially the same instant in time, wherein said first sampling clock determines the time points at which said first converter samples said input signal.

18. The device of claim 17, wherein each of said plurality of sampling clocks is generated by dividing a master clock signal of a higher frequency with a divider number, but from a different phase of said master clock signal, wherein said reference clock is generated by dividing said master clock signal by a co-prime number in relation to said divider number.

19. The device of claim 18, wherein said plurality of reference values comprise a plurality of subset of reference values, wherein each of said plurality of subset of reference values is used by said estimation unit to generate the correction factor for a corresponding one of said plurality of converters.

20. The device of claim 19, wherein said parameter value relates to a gain error and a DC offset error, said estimation unit generating a gain correction term and a DC offset correction term such that the sum of the magnitudes of error values obtained as a difference of a first signal represented by a first group of codes contained in said first subset of digital codes and a second signal represented by a second group of reference values contained in said second subset of reference values is minimized.

21. The device of claim 20, wherein said parameter value relates to a sampling time error, said estimation unit generating a timing correction term, wherein said estimation unit generates said timing correction term by subtracting a third signal represented by a fifth group of codes contained in said first subset of digital codes and a fourth signal represented by a sixth group of reference values contained in said second subset of reference values to yield a second error value, wherein said fifth group of codes is obtained by time shifting the sampling clock by a first magnitude, wherein said first magnitude is determined iteratively to minimize said second error value.

22. An apparatus for generating a plurality of digital codes representing an input signal, said apparatus being contained in an interleaved analog to digital converter (ADC) containing a plurality of converters, said apparatus comprising:

means for sampling a portion of said input signal at different time instances using said plurality of converters to generate a first plurality of digital codes, wherein each of said plurality of converters generates a corresponding one of a plurality of subset of digital codes, said plurality of subset of digital codes together forming said first plurality of digital codes;

means for sampling said portion at the same time instances as sampled by a first converter to generate a set of reference values, wherein said first converter is contained in said plurality of converters and said plurality of subset of digital codes contains a first subset of digital codes generated by said first converter;

means for computing a difference of signals representing said set of reference values and said first subset of digital codes;

means for estimating a correction factor to compensate for mismatch of a parameter of said first converter; and means for correcting the parameter corresponding to said first converter, wherein a magnitude of each of said digital codes depends on a value of said parameter of said first converter and wherein said correcting changes said value, whereby said first converter operates with said corrected parameter in sampling future portions of said input signal after said correcting, and wherein said plurality of digital codes are generated in parallel to correcting said parameter.

23. The apparatus of claim 22, wherein said parameter comprises one of a gain, a DC offset and a timing of said first converter.

24. The interleaved ADC of claim 1, wherein said first converter generates a second subset of digital codes by sampling another input signal, wherein said another input signal is identical to said input signal but the magnitudes of said second subset of digital codes are respectively different from the magnitudes of said subset digital codes of said first converter due to said changed parameter value.

25. The device of claim 14, wherein said first converter generates a second subset of digital codes by sampling another input signal, wherein said another input signal is identical to said input signal but the magnitudes of said second subset of digital codes are respectively different from the magnitudes of said subset digital codes of said first converter due to said changed parameter value.

* * * * *